United States Patent [19]

Miyamoto

[11] Patent Number: 4,707,773
[45] Date of Patent: Nov. 17, 1987

[54] PARALLEL LIGHT MOVING TYPE EXPOSURE APPARATUS

[75] Inventor: Hiroshi Miyamoto, Tokyo, Japan

[73] Assignee: ORC Manufacturing Co., Ltd., Tokyo, Japan

[21] Appl. No.: 894,917

[22] Filed: Aug. 8, 1986

[30] Foreign Application Priority Data

Apr. 28, 1986 [JP] Japan .................................. 61-98936

[51] Int. Cl.4 ............................................. F21V 7/00
[52] U.S. Cl. .................................... 362/303; 362/304; 34/1
[58] Field of Search ......................... 362/303, 296–299, 362/306, 304; 34/1, 4, 39, 40, 68

[56] References Cited

U.S. PATENT DOCUMENTS 2,198,014  4/1940  Ott ....................................... 362/303

FOREIGN PATENT DOCUMENTS

| 69268 | 9/1940 | Czechoslovakia | 362/303 |
| 130041 | 1/1932 | Fed. Rep. of Germany | 362/303 |
| 1067748 | 5/1956 | Fed. Rep. of Germany | 362/296 |

Primary Examiner—James C. Yeung
Attorney, Agent, or Firm—Cushman, Darby & Cushman

[57] ABSTRACT

A parallel light moving type exposure apparatus including a light source adapted to cause parallel lights to be obtained by the lights reflected from a parabolic reflector, said light source and a material to be exposed being moved relative to each other to perform the exposure, comprises a first light-shielding member and a second light-shielding member. The former is intended to be used for preventing the lights from the light source from being directly irradiated onto the material to be exposed. The latter is intended to be used for making uniform the cumulated amounts of lights on points of the material to be exposed.

8 Claims, 6 Drawing Figures

ILLUMINATION DISTRIBUTION

ILLUMINATION DISTRIBUTION

PARALLEL LIGHT MOVING TYPE EXPOSURE APPARATUS

BACKGROUND OF THE INVENTION

1. Field of the Invention

The present invention relates to an exposure apparatus which is adapted to expose a material to be exposed to parallel lights in a manner that the material or the parallel lights are moved and, more particularly, to a parallel light moving type exposure apparatus which is capable of obtaining a uniform cumulated amount of light and a wide area of irradiation.

2. Description of the Prior Art

Where a work such as a printed board, or printed circuit board is exposed to and baked by lights, it is necessary that an image of a printing mask is reproduced with high precision onto the work. To this end, it is preferable to use an exposure apparatus which uses parallel lights. Conventionally, an exposure apparatus was such that, as shown in FIG. 4A, a large-depth parabolic reflector 101 is employed within which a point light source 103 is provided together with a light-shielding member 102 which is located right beneath the light source 103. The light-shielding member 102 is made spherical to remove the direct irradiation by reflection or absorption so as to obtain only parallel lights. By that shadow of the light-shielding member 102 which is necessarily produced at that time on an irradiation plane, this irradiation plane is limited and any point on a material to be exposed such as a mask or a work which passes therethrough is exposed to light always with a specified amount of light.

The above-mentioned old technique, however, had the following problems. Firstly, since the light-shielding member 102 utilizes a reflection, an irregular reflection is produced due to, for example, the light source 103 being not an ideal point light source 103. It disturbs the parallel lights. For this reason, the practical use was impossible. Secondly, the light-shielding member 102 adapted for shielding the direct irradiation in an optimum manner and obtaining an optimum cumulated amount of light is not easy to design or adjust because its size, shape and a distance as measured from the light source affect each other in a complicated manner. Thirdly, the point light source 103 is actually not a point light source but is of some largeness or of some depth, so that the lights obtained are not complete parallel lights. For this reason, in order to obtain a precise area of exposure, it was necessary to dispose the light-shielding member at a position closer to that of the material to be exposed. This results in a decrease in area of the zone in which the direct irradiation is shielded. In order to avoid the material from receiving the direct irradiation, it was necessary to dispose the material to be exposed at a position farther away from the position of the light-shielding member 102, and/or to make the light-shielding member 102 larger in size. These countermeasures, however, cause a decrease in the utilizing efficiency with which the light source 103 is utilized. Fourthly and finally, the decrease in the light-source utilizing efficiency made it necessary to use a large-depth parabolic reflector. The use of such a large-depth parabolic reflector, however, results in an illumination distribution in which the light intensity is greatly uneven, as shown in FIG. 4. This makes it difficult to calculate the cumulated amount of light and, at the same time, to make the usable exposure area narrow.

SUMMARY OF THE INVENTION

The present invention has been made in order to solve the above-mentioned problems which are inherent in the prior art and the object thereof is to provide a parallel light moving type exposure apparatus which can provide a large exposure area, permit the material to be exposed to be disposed at a position closer to that of a light source, and, at the same time, is easy to design and manufacture.

To attain the above object, according to the present invention, there is provided a parallel light moving type exposure apparatus which includes a light source adapted to obtain parallel lights by the lights reflected from a parabolic, or similar, reflector, whereby the light source and a material to be exposed are moved relative to each other to perform the exposure, comprising a first light-shielding member for preventing the lights from the light source from being directly irradiated onto the material to be exposed, and a second light-shielding member capable of making uniform the cumulated amounts of lights on points of the material to be exposed.

The first light-shielding member only serves as a means for obtaining parallel lights. It, therefore, can be disposed, with an optimum size, at an optimum position which is approximate to the light source. This makes it possible to shield the direct lights over a wide range. As a result, it becomes possible to locate the material to be exposed at a position closer to the light source. Further, it is possible to dispose the second light-shielding member at a position close to the material to be exposed in a state wherein it has an optimum shape and a required minimum size, both said shape and size being capable of causing an equal cumulated amount of light to be imparted to any portion of the material to be exposed when the same is exposed during the moving exposure. It is thus possible to make the exposure area large. In this way, according to the invention, since the two light-shielding members have independent functions, they become easy to design and adjust. Further, since the material to be exposed is located close to the position of the light source and the exposure area is large, the efficiency of utilizing the light source becomes high. On the other hand, since the light-source utilizing efficiency becomes high and yet the direct irradiation can be prevented over a wide range, it becomes possible to use a small-depth parabolic reflector. Thus, the illumination distribution is improved so as to enhance the uniformity with which parallel lights are cumulated on the material to be exposed.

DESCRIPTION OF THE PREFERRED EMBODIMENTS

Figure 1:
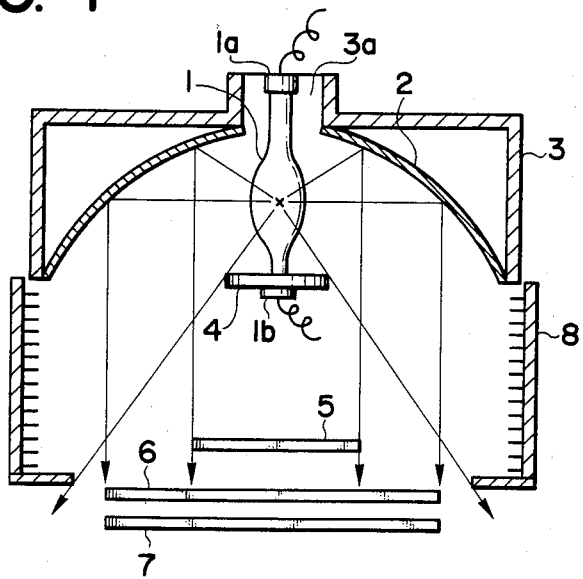
FIG. 1 is a vertically sectional view showing a parallel light moving type exposure apparatus in accordance with an embodiment of the invention.
Figure 3A:
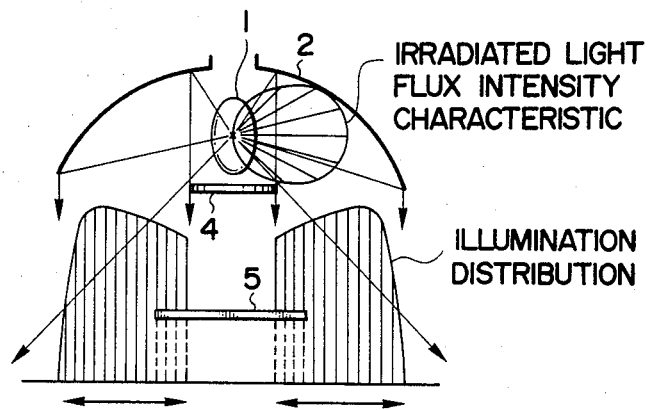
FIGS. 3A and 3B are a vertically sectional view, and a view of an exposure plane, of the exposure apparatus of the embodiment, showing the illumination distribution thereof; and, FIGS. 4A and 4B are a vertically sectional view, and a view of an exposure plane, of the exposure apparatus of the prior art, showing the illumination distribution thereof.
Figure 3B:
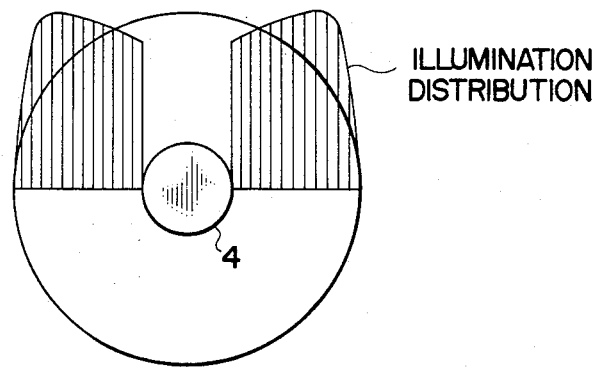
Figure 4A:
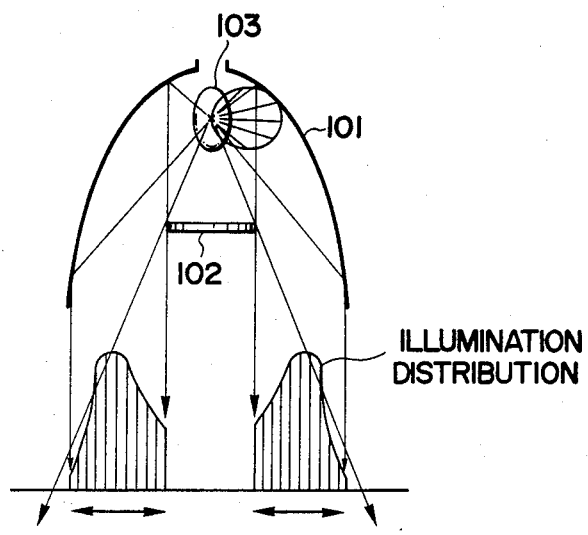
Figure 4B:
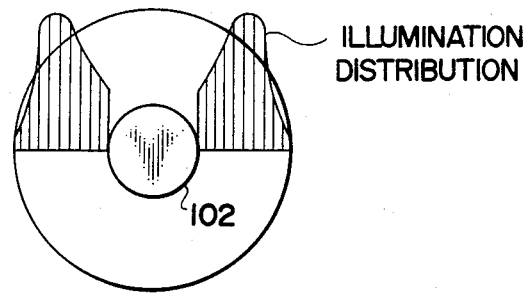

FIG. 1 is a vertically sectional view showing a parallel light moving type exposure apparatus in accordance with an embodiment of the invention. A lamp 1 which constitutes a light source is located at a position corresponding to a focal point of a parabolic reflector. The lamp 1 and the reflector 2 are received within a lamp house 3. An upper mouthpiece 1a and a lead wire are led outside by way of an opening at the center of a recessed portion of the parabolic reflector 2 and by way of an opening 3a at the upper end of the lamp house 3. A lower mouthpiece 1b of the lamp 1 and a lead wire, together with a first light-shielding member 4 provided right beneath the lamp, are led outside through the lamp house 3 by being supported by suitable bars. The opening 3a of the lamp house concurrently serves also as an air exhaust port used for ventilation and cooling. The first light-shielding member 4 acts to prevent the light from the light source from being directly irradiated over a mask 6 and a work 7 so as to permit the same to be exposed to parallel lights only. The first light-shielding member 4 is applied thereto with a light absorber such as carbon particles so as to prevent irregular reflection therefrom. A rise in temperature due to such application of light absorber is coped with by blowing an air by, for example, a fan from a lateral direction. In the vicinity of the mask 6, a second light-shielding member 5 is disposed in a manner to oppose the mask 6, and is supported within the lamp house 3 by means of suitable bars. In this embodiment, since a small-depth parabolic reflector is used, it happens that the lights from the light source are radiated outside an exposure zone. In order to prevent such lights from being scattered, a cylindrical member 8 intended to shield and absorb such lights is provided at the outer periphery of the parabolic reflector 2. Consequently, the mask 6 and work 7 are exposed to only the lights reflected from the parabolic reflector 2. That is, the mask 6 and work 7 are exposed to only the substantially parallel lights. This prevents the clearness of image from being degraded due to the action of the scattered lights. The use of the small-depth parabolic reflector 2 brings about the following advantages. Namely, the illumination distribution is less uneven in terms of light intensity than in the prior art as shown in FIGS. 3A and 3B. Thus, it becomes possible to utilize a wider area of exposure and, at the same time, measurement of the cumulated amount of light and cumulation of light energy become easy, whereby it is possible to increase the uniformity with which lights are cumulated on points of the work.

Figure 2:
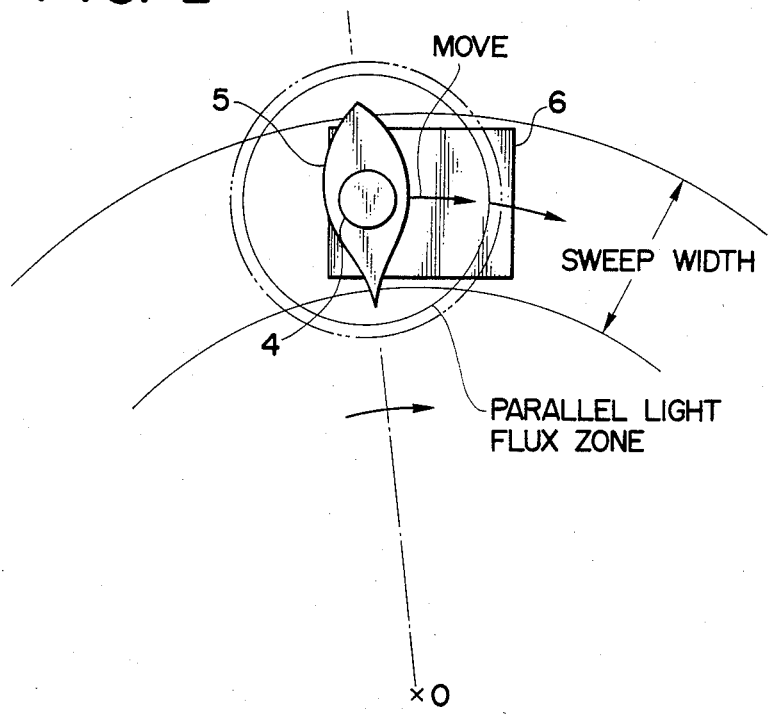
FIG. 2 is a view for explaining a second light-shielding member in accordance with an embodiment of the invention.

FIG. 2 is a view, as taken from above, of a second light-shielding member in accordance with an embodiment of the invention, said view being intended to be used for explaining the action of that member. In this embodiment, the parallel light source is circumferentially moved about a center 0 and, in this path of movement of the parallel lights, the mask 6 and the work 7 are disposed and fixed so as to permit a moving exposure thereof to be effected. This aims to cause the cumulated amount of light to become a specified value at any point of the exposure plane. To this end, the shape of the second light-shielding member 5 is determined by calculation of the cumulated amount of light or by measurement thereof using cumulated-light-amount measuring devices disposed at various positions involved.

As will be understood from the foregoing description, the first light-shielding member 4 and the second light-shielding member 5 perform their respective independent functions. For this reason, the position and shape thereof can be determined to optimum ones by designing or adjustment without any influence by the other function.

The present invention is not limited to the above-mentioned embodiments but permits various modifications to be made in accordance with the subject matter of the invention. For example, in FIG. 2, exposure was carried out by moving the light source. However, the invention permits a moving of the material to be exposed, or permits the light source or the work to be moved in a linear manner. Further, the light source is not limited to a point light source but permits the use of a linear light source. In this case, a semi-cylindrical reflector may be used as the reflector involved. Further, the reflector is not limited to a parabolic reflector but may be a similar one.

As has been described above, according to the present invention, since the exposure apparatus is provided with a second light-shielding member capable of uniformizing the cumulated amount of light during the moving exposure, the first light-shielding member can be disposed at a position close to the light source so as to widen the light-shielded zone. As a result, the efficiency of utilizing the light source is increased and in consequence the use of a small-depth parabolic reflector becomes possible. At the same time, a wider area of exposure is obtained. Further, since the first and second light-shielding members perform their respective independent functions, their design and manufacture become easy with the result that a more uniform exposure is possible.

What is claimed is:

1. A light generator for directing parallel light rays perpendicularly toward a material to be exposed in a parallel light moving-type exposure apparatus wherein the light generator and the material to be exposed are moved relative to one another to perform the exposure, the light generator comprising:
   a reflector, said reflector having a concave, curved surface directed toward the material to be exposed;
   a light source disposed intermediate said concave, curved surface and the material to be exposed;
   a first light-shielding means disposed between said light source and the material to be exposed for preventing light rays emitted from said light source from being directly irradiated onto the material to be exposed; and
   a second light-shielding means for enabling the uniform distribution of light rays on the material to be exposed, said second light-shielding means being disposed intermediate said first light-shielding means and the material to be exposed.

2. A light generator as in claim 1, wherein said reflector is a small-depth type and further comprising a cylindrical shielding member mounted so as to be disposed adjacent and in surrounding relation to the outer periphery of said reflector for shielding and absorbing light rays radiated exteriorly of a predetermined exposure zone.

3. A light generator as set forth in claim 1, wherein said second shielding means has a greater surface area than said first shielding means.

4. A light generator as in claim 1, wherein the shape of said second light shielding means is a function of the amount of light radiated towards various points in the area being exposed.

5. A light generator as in claim 1, further comprising a light absorber applied to a surface of said first light shielding means.

6. A light generator as in claim 5, wherein said light absorber includes carbon particles.

7. A light generator as in claim 1, wherein said reflector is parabolic in shape.

8. A light generator as in claim 1, wherein said reflector is semi-circular in shape.

* * * * *